United States Patent [19]
Levitan

[11] Patent Number: 5,894,487
[45] Date of Patent: Apr. 13, 1999

[54] ERROR DETECTION OF DIRECTORY ARRAYS IN DYNAMIC CIRCUITS

[75] Inventor: David Stephen Levitan, Austin, Tex.

[73] Assignee: International Business Machines Corporation, Armonk, N.Y.

[21] Appl. No.: 08/892,722

[22] Filed: Jul. 15, 1997

[51] Int. Cl.[6] .................................................. G06F 11/00
[52] U.S. Cl. ...................... 371/67.1; 371/70; 395/183.06; 711/3
[58] Field of Search .......................... 371/67.1, 70; 711/3, 711/111, 112, 113, 118, 123, 126; 395/183.18, 185.06; 364/243.4, 243.41, 964.2, 964.25

[56] References Cited

U.S. PATENT DOCUMENTS

| | | | |
|---|---|---|---|
| 4,084,236 | 4/1978 | Chelberg et al. | 364/200 |
| 4,332,010 | 5/1982 | Messina et al. | 711/3 |
| 4,464,717 | 8/1984 | Keeley et al. | 364/200 |
| 4,667,288 | 5/1987 | Keeley et al. | 364/200 |
| 4,831,622 | 5/1989 | Porter et al. | 371/10 |
| 5,283,876 | 2/1994 | Tague | 395/400 |
| 5,473,561 | 12/1995 | Jones et al. | 711/3 |
| 5,581,725 | 12/1996 | Nakayama | 711/122 |
| 5,682,515 | 10/1997 | Lau et al. | 711/118 |
| 5,710,905 | 1/1998 | Wan | 711/118 |

*Primary Examiner*—Trinh L. Tu
*Attorney, Agent, or Firm*—Sawyer & Associates; Anthony V. England

[57] ABSTRACT

A system and method for providing error detection in a directory has been disclosed. The method and system include comparing a first group of data and a second group of data to provide a comparison signal and detecting errors in response to the comparison signal.

28 Claims, 4 Drawing Sheets

ERROR DETECTION OF DIRECTORY ARRAYS IN DYNAMIC CIRCUITS

FIELD OF THE INVENTION

The present invention relates to a method and system for detecting an error in information which is stored in a memory element, and more particularly to a method and system for detecting erroneous information stored in a cache directory.

BACKGROUND OF THE INVENTION

In modern microprocessor design, there is a trend toward increasing operating speeds, cache sizes, and, therefore, the size of cache directory address tags. There is an accompanying increase in the likelihood of errors in the information, such as address tags, stored in a cache directory. For example, a tag having more bits has increased occurrences of a alpha particle having flipped a bit. Thus, error detection is increasingly important. Error detection of this sort typically involves comparing redundant information for consistency.

One conventional way that microprocessor operating speed is increased is to employ dynamic logic circuitry. Such circuitry is particularly useful for control logic associated with cache directories because the speed of comparing address tags may be a limiting factor in the speed of reading and writing to a cache. However, dynamic circuitry is not well suited to logical inversions, which are required for comparing bits or bytes of information, for example to detect data errors.

Accordingly, what is needed is a method and system for fast and efficient detection of data errors. The need is particularly acute for such a method and system that is compatible with dynamic logic circuitry. The present invention addresses such a need.

SUMMARY OF THE INVENTION

The present invention provides a method and system for providing error detection in a directory. The method and system comprise comparing a first group of data and a second group of data to provide a comparison signal and detecting errors in response to the comparison signal.

According to the system and method disclosed herein, the present invention provides error detection that requires fewer inversions, less time and less circuitry. In addition, error detection is provided at lower cost.

DETAILED DESCRIPTION OF THE INVENTION

Figure 1A:
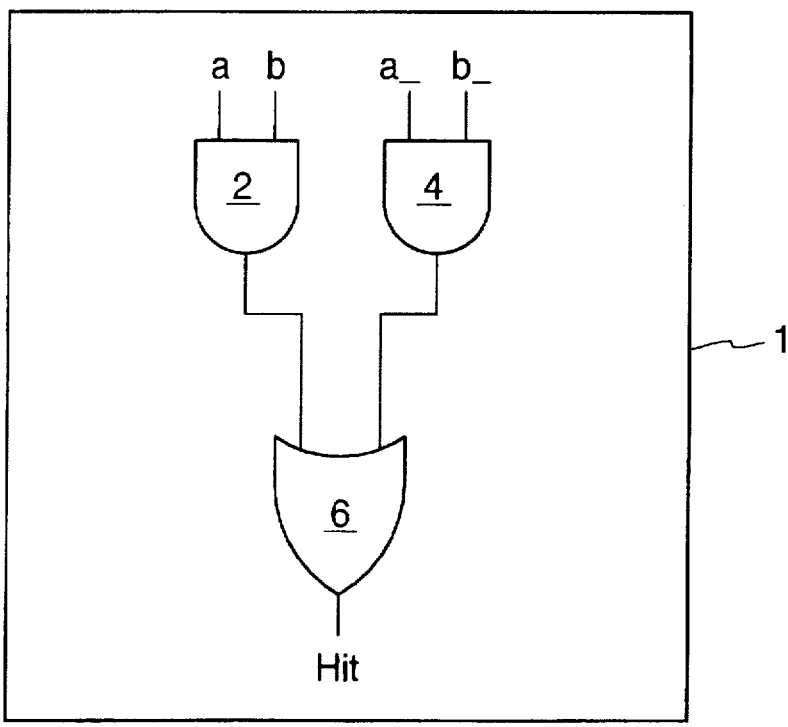
FIG. 1a is a logic diagram showing logic gates for detecting a hit in the comparison of first and second instances of one bit, where true/complement format is used.

The present invention relates to an improvement in error detection which is well suited for detecting errors in an address residing in a cache directory and used in connection with accessing the cache. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Associative caches are used in modern microprocessors. In order to access an associative cache, a conventional system checks address tags stored in a cache directory. In other words, a requested line of information in the cache may be situated in the cache within a certain set of locations. To identify the information in the cache, the address of the requested line is compared with each of the directory tags for the set of cache locations. Each comparison detects a match (a "hit") or a non-match (a "miss") between the requested line's address and one of the directory address tags.

Dynamic circuitry is also employed in modern microprocessors, for example in control logic associated with cache directories. Such circuitry is used in cache directories because the speed of comparing address tags may limit the speed of accessing a cache.

Although dynamic circuitry is generally fast, inversions in dynamic circuitry are costly from a time perspective. Many operations, including error detection, require the complement of the data. Therefore, some conventional dynamic directory arrays store both the true data and its complement. Storing both the true data and its complement is known as true/complement format. The data and its complement may be stored directly in true/complement format or represented using a different format.

Another method of representing data is b2 encoding. In b2 encoding, two bits are mapped to four bits. The b2 encoding has lower power consumption and some speed advantages as compared to the true/complement format. In addition, the b2 encoding represents all the possible combinations for the two bits being encoded. Therefore, the complement of the true data is not required.

When error free, b2 encoding of two bits has exactly one bit on. If the binary encoding of two bits has both the bits on, the b2 encoding has the first bit on and the following bits off. Where the binary encoding of two bits has the first bit on and the second off, the b2 encoding has the first bit off, the second bit on, and the last two bits off. Where the binary encoding has the first bit off and the second bit on, the b2 encoding has the first two bits and the last bit third bit on. Finally, where the binary encoding of two bits has both bits off, the b2 encoding has only the last bit on.

In either true/complement format or b2 encoding, an address may be divided into parts. In a request from a processor for access to a line in a cache, the request identifies an address for the line. An upper portion of such a requested address corresponds in some manner to address tags in the cache directory. Thus, in some systems, the upper portion of the address corresponds directly to the tag. In other systems, a translation of the upper portion of the address corresponds to the tag. These details will be omitted in the description that follows. Instead, the portion of the address and the tag are referred to as instances of an address. Therefore, comparing a portion of a requested address to a tag in a cache directory may simply be described as comparing instances of an address.

In addition, an address represented by a directory tag may not be the same address as the requested address. Consequently, when comparing the requested address and the tag, a comparison is being made of a first instance of a first address and a first instance of a second address. Nevertheless, for simplicity, this may be described herein as comparing first and second instances of an address.

If the instances match, a hit has occurred and a hit signal is generated. However, it should be understood that this assumes that the address is valid. The validity of an address may be indicated by a "valid bit" which is also tested. However, such a valid bit is not shown or discussed further herein. If the instances do not match, a miss has occurred, and a miss signal is generated. Normally, in a system with dynamic logic, the hit feeds certain downstream dynamic logic while the miss feeds other downstream dynamic logic. The hit and miss are typically generated independently.

Figure 1B:
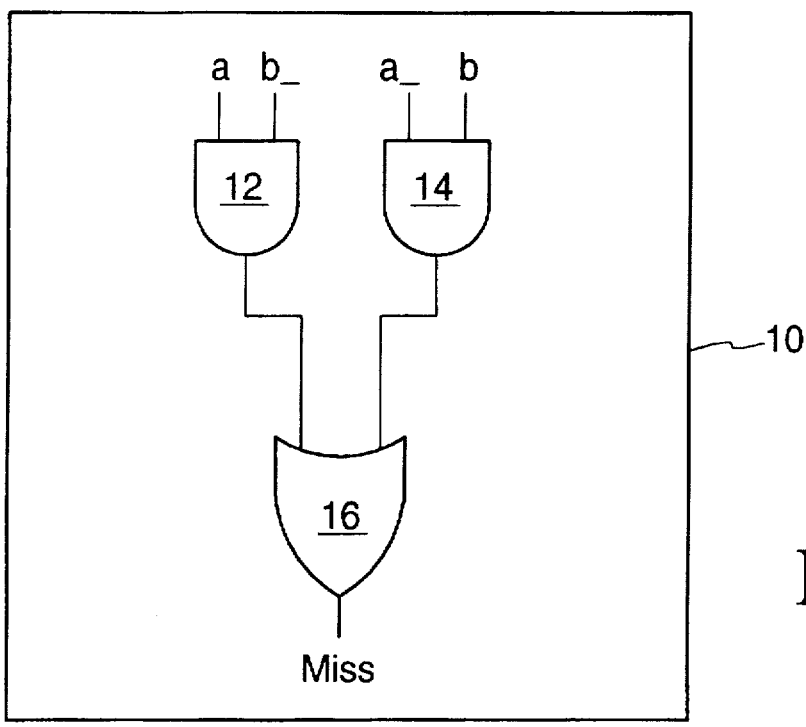
FIG. 1b is a logic diagram showing logic gates for detecting a miss in the comparison of first and second instances of one bit, where true/complement format is used.

A hit and miss may be generated as follows for true/complement data. In simple terms, suppose "a" is bit of an address asserted by a processor seeking access to a line in a cache, and "b" is a corresponding bit of a tag for a line in the cache directory. Thus, "a" and "b" are bits in two instances of an address. Furthermore, a__ and b__ are the complements of a and b, respectively. A hit for a and b will be generated by (a AND b) OR (a__ AND b__). The miss is generated by (a AND b__) OR (a__ AND b). FIGS. 1a and 1b depict logic circuitry for generating a hit and a miss, respectively, for two instances of a bit in true/complement format. To generate a hit for an entire address and tag, the hits for each address and tag bit are combined using an AND operation. To generate a miss for an entire address and tag, the misses for each address and tag bit are combined using an OR operation.

Suppose a and b are instances of an address in b2 encoding. Thus, a is composed of the four bits a(0), a(1), a(2), and a(3). Similarly, b is composed of b(0), b(1), b(2), and b(3). A hit between this portion of the address and tag is generated by (a(0) AND b(0)) OR (a(1) AND b(1)) OR (a(2) AND b(2)) OR (a(3) AND b(3)). A miss between this portion of the address and the tag is generated by (a(0) AND (b(1) OR b(2) OR b(3))) OR (a(1) AND (b(0) OR b(2) OR b(3)) OR (a(2) AND (b(0) OR b(1) OR b(3))) OR (a(3) AND (b(0) OR b(1) OR b(2))).

Figure 2A:
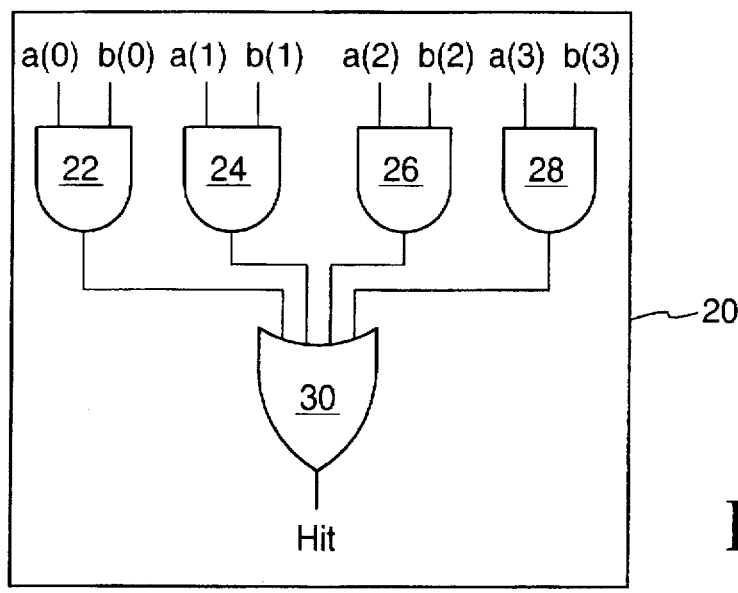
FIG. 2a is a logic diagram illustrating logic gates for detecting a miss in the comparison of first and second instances of a four bit byte, where b2 encoding is used.
Figure 2B:
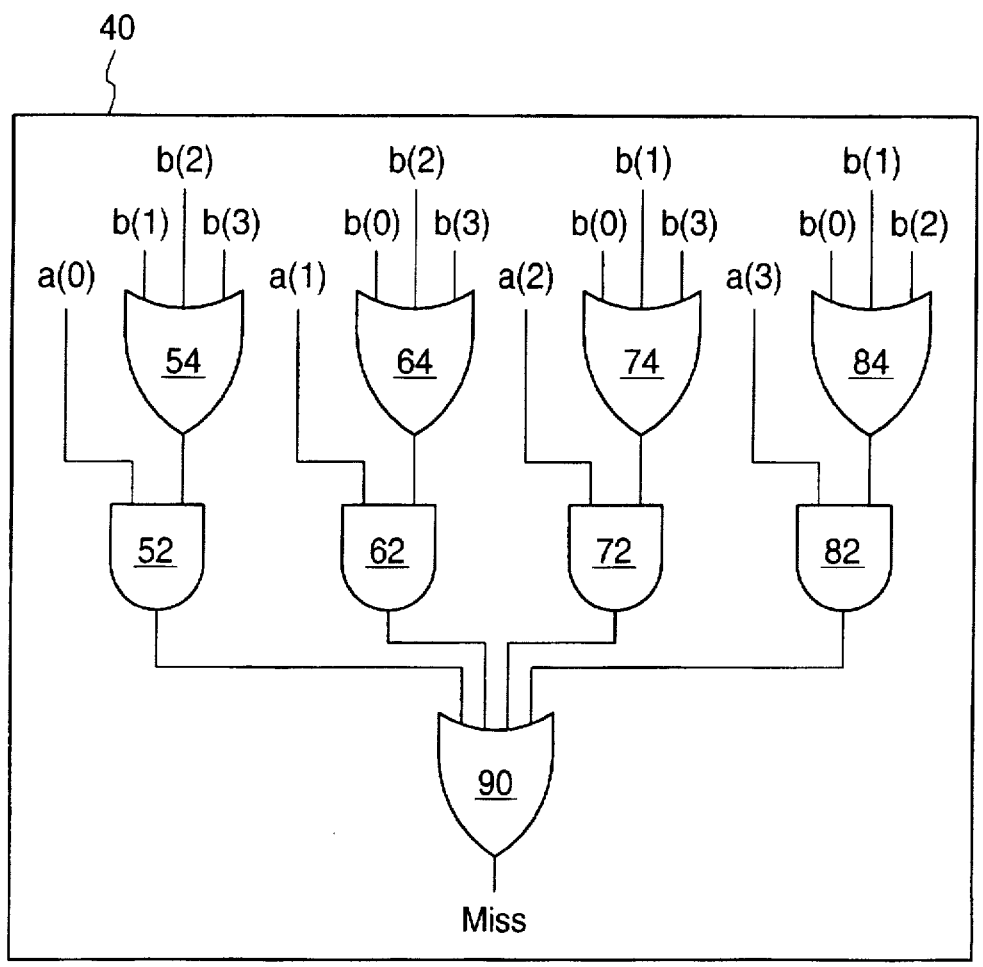
FIG. 2b is a logic diagram depicting logic gates for detecting a miss in the comparison of first and second instances of a four bit byte, where b2 encoding is used.

FIGS. 2a and 2b depict the logic circuitry for generating a hit and miss, respectively, for two instances of a byte in b2 encoding. As in true/complement format, a hit for an entire address and tag in b2 encoding is generated by performing an AND operation on the hits for each portion of the address and tag. Similarly, to generate a miss for an entire address and tag, an OR operation combines the misses for each portion of the address and tag.

In connection with accessing a line in a cache, the cache directory tag for the line may be checked to confirm that the tag does not contain errors, for example errors due to an alpha particle having flipped a bit in the tag. Conventional systems may check for such an error by checking each bit of the tag. For example, in the true/complement format, each bit of the true tag residing in the cache would be checked against each bit of the complement tag stored in the cache directory. Circuitry which performs inversions would be used to execute the error checking. Furthermore, such circuitry may be exclusively dedicated to tag checking. Similarly, to detect error in a tag stored using b2 encoding, each group of four bits in b2 encoding may be checked to ensure that exactly one bit is on.

Although such a conventional system is capable of detecting errors, one of ordinary skill in the art will recognize that such error detection may require a large number of inversions. In dynamic circuitry, inversions can only be performed on clock transitions and may require undesirable circuitry. Thus, one of ordinary skill in the art will readily realize that conventional error detection in directory arrays of dynamic circuits is very costly from a time perspective and that significant additional circuitry is required.

Figure 3:
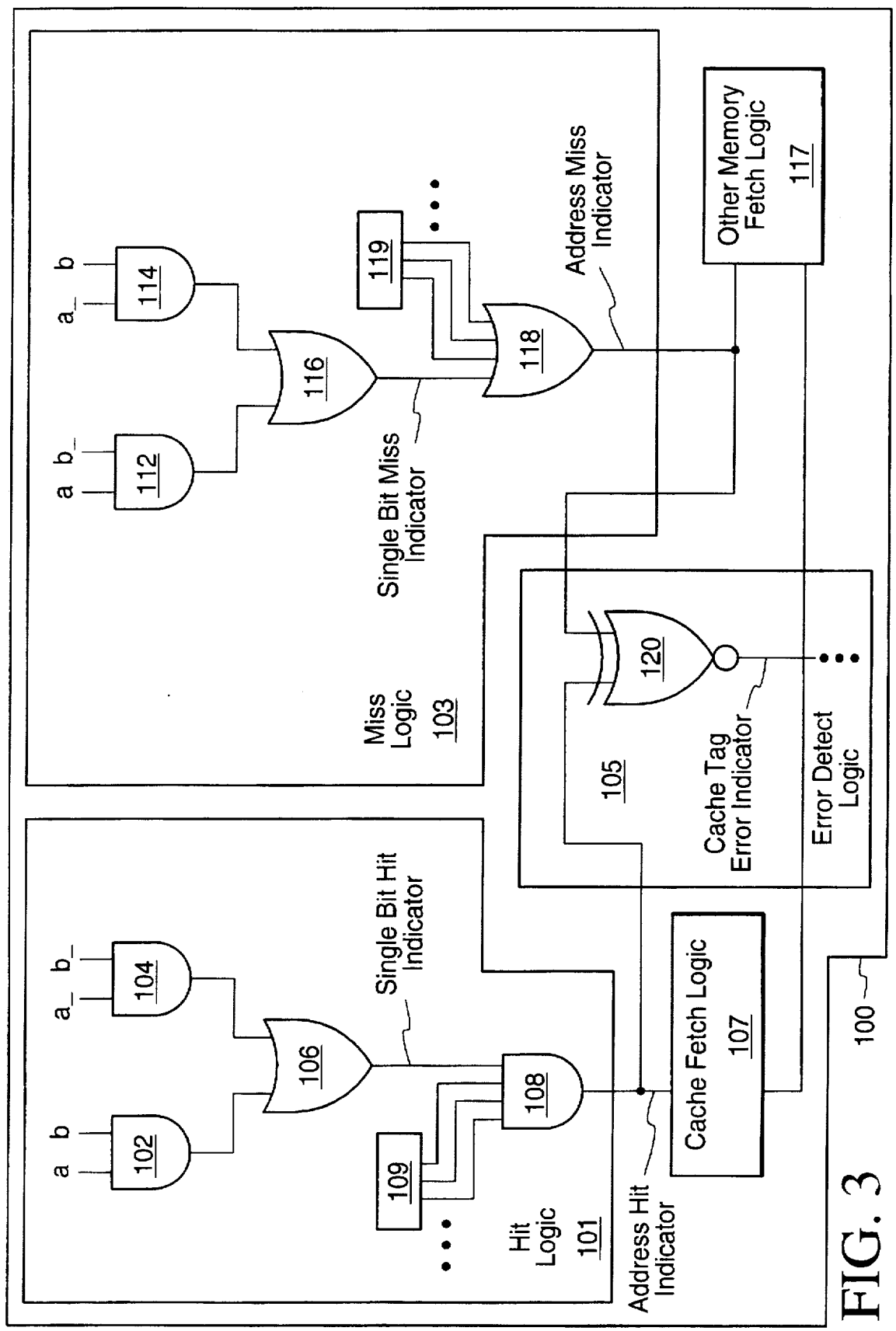
FIG. 3 is a logic diagram displaying logic gates for an embodiment of the method and system which detects errors in a cache address in connection with a comparison of first and second instances of the address, where true/complement format is used.

Refer now to FIG. 3 depicting a block diagram of one embodiment of the present invention, wherein system 100 uses true/complement format. In FIG. 3, hit logic 101 and miss logic 103 are for an entire address. As in FIGS. 1a and 1b, "a" is an address bit asserted by a processor seeking access to a line in a cache and "b" is a tag bit for a line in the cache directory. Thus, "a" and "b" are instances of an address bit. In addition, "a__" and "b__" are complements of a and b, respectively. For these two instances of the address bit, a hit signal is generated using hit logic composed of gates 102, 104, and 106, just as gates 2, 4 and 6 are used in FIG. 1a. A miss signal is generated using miss logic composed of gates 112, 114, and 116, just as gates 12, 14, and 16 are used in FIG. 1b. Similarly, for other bits of the address (not shown), sets of logic gates are provided in the same fashion as sets 102, 104, 106 and 112, 114, 116. The sets of logic gates for the other bits are not individually shown, but are collectively illustrated in FIG. 3 as logic blocks 109 and 119, respectively.

According to the embodiment, hit logic 101 and miss logic 103 are part of a cache controller for a multi-way, set associative cache. The signals generated by hit logic 101 and miss logic 103 are used not only for finding a directory tag which matches a requested cache line address, but are also used for logic which detects an error in the directory tag, obviating the need for at least a portion of circuitry which otherwise would be dedicated exclusively to error checking. That is, a collective hit signal for the entire address is generated in hit logic 101 by combining hit signals for each pair of instances of each bit using the AND gate 108. This signal is fed to other circuitry in the cache controller, for example, circuitry 107 for fetching information in the multi-way, set associative cache in response to which of the "ways" is indicated. In addition, the signal is fed to error detection logic 105. Similarly, a collective miss signal for the entire address is generated by miss logic 103 by combining the miss signals for each pair of instances using the OR gate 118. This signal is fed to other circuitry in the cache controller, for example, circuitry 117 for fetching requested information from another memory in response to an indication that the information is not in the cache. In addition, the signal is fed to error detection logic 105.

The error detection logic 105 uses the signals from logic 101 and 103 as follows. For a tag identified as matching the address of the requested line, all the signals input to AND gate 108 of hit logic 101 should indicate a hit for every bit. Similarly, all the signals input to OR gate 118 in miss logic 103 should indicate a miss for every bit. Therefore, assuming that there is no error in the address of the requested cache line (i.e. in the a and a__ bits shown, and other corresponding bits not shown but implied in logic 109 and logic 119), the collective hit signal from hit logic 101 and the collective miss signal from miss logic 103 should be orthogonal if there are no errors in the tag which has been identified as an address match. Therefore, in the illustrated embodiment, the collective hit signal and the collective miss signal are inputted to the exclusive NOR ("XNOR") gate 120 of error detection logic 105. The output is considered to indicate whether there is an error in the identified tag in the cache directory. This output is fed to other circuitry, such as circuitry 117 for refetching information to the cache, and circuitry 107 for fetching information from the cache. That is, in response to a cache hit combined with a cache tag error indication cache fetching by circuitry 107 will be disabled and refetching by circuitry 117 will be triggered. The error detection signal may also be fed to other circuitry (not shown), such as circuitry in the cache controller for indicating a non-recoverable error.

Figure 4:
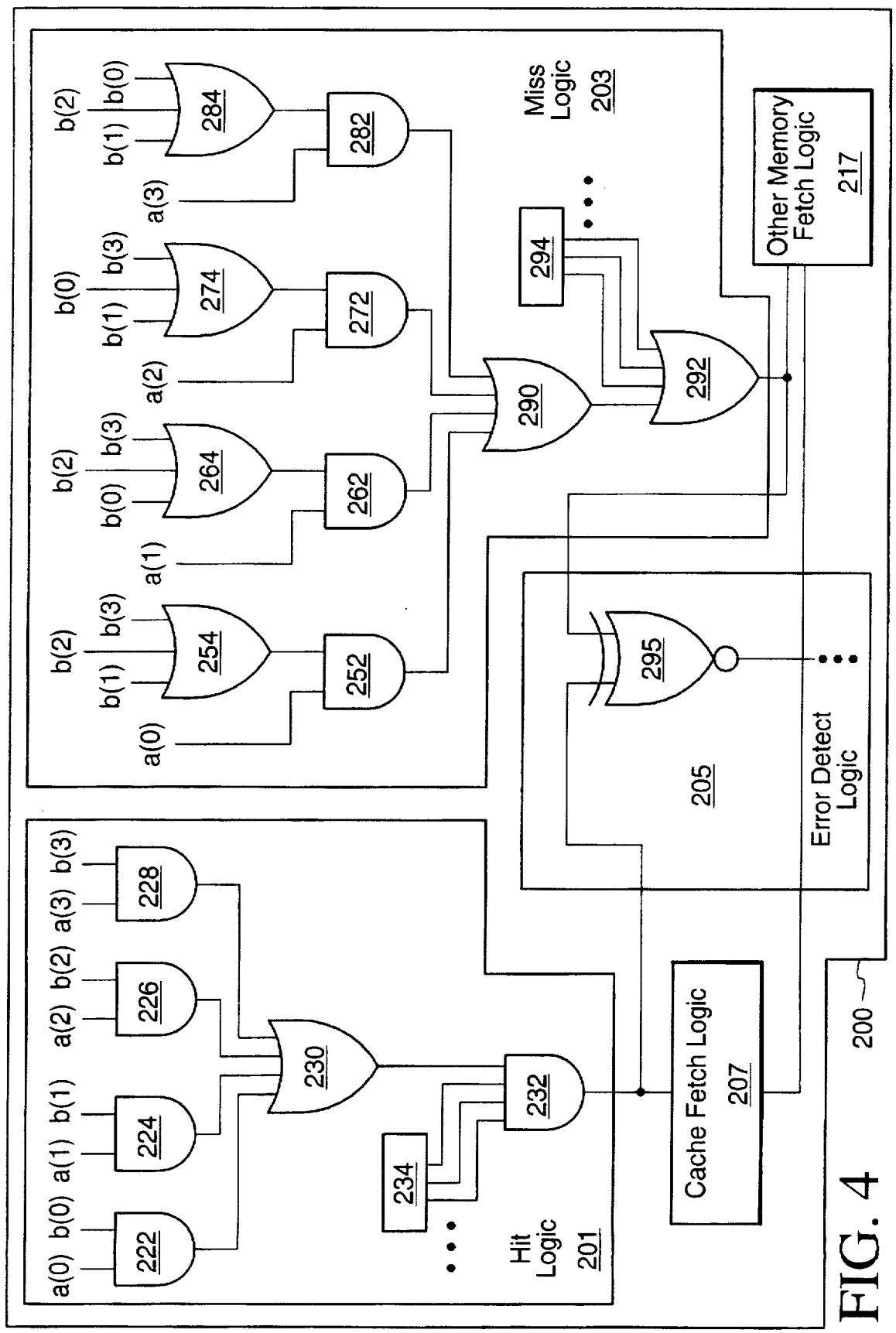
FIG. 4 is a logic diagram showing logic gates for an embodiment of the method and system which detects errors in a cache address in connection with a comparison of first and second instances of the address, where b2 encoding is used.

Refer now to FIG. 4, depicting another embodiment of the method and system, using b2 encoding. As in the embodiment of FIG. 3, hit logic 201 and miss logic 203 are part of a cache controller for a multi-way, set associative cache. The signals generated by hit logic 201 and miss logic 203 are used not only for finding a directory tag which matches a requested cache line address, but are also used for logic which detects an error in the directory tag, obviating the need for at least a portion of circuitry which otherwise would be dedicated exclusively to error checking.

In FIG. 4, hit logic 201 and miss logic 203 are for an entire address. As in FIGS. 2a and 2b, "a" is a byte asserted by a processor seeking to access a line in a cache and "b" is a byte for a tag for a line in the cache directory. Thus, a and b are instances of an address. For these instances of an address, a hit signal is generated using logic gates composed of 222 through 230, as in FIG. 2a. Similarly, a miss signal for these instances of an address is generated using miss logic composed of gates 252 through 290. Similarly, for other bits of the address (not shown), sets of logic gates are provided in the same fashion as sets 222, 224, 226, 228, 230 and 252, 254, 262, 264, 272, 274, 282, 284, 290. The sets of logic gates for the other bits are not individually shown, but are collectively illustrated in FIG. 4 as logic blocks 234 and 294, respectively. A collective hit signal for the entire address is generated by combining the hit signals for pair of instances using the AND gate 232. The OR gate 292 generates a collective miss signal for the entire address by combining the miss signals for each pair of instances. The XNOR gate 295 in error detection logic 205 provides a resultant output signal indicating whether there is an error in the identified tag in the directory. In a fashion similar to system 100 of FIG. 3, the error detect logic 205 feeds a signal to other circuitry such as 207 and 217 in the cache controller.

In dynamic logic, error checking is particularly difficult. For example, an inversion is required to detect an error due to a bit being turned off. Such inversions make error in dynamic logic does time consuming. However, certain errors in the tag result in the hit and miss signals being both on or both off. This property of the hit and miss signals is due to the way in which the instances of addresses are combined to generate the hit and miss. Consequently, the hit and miss signals can be used to detect errors.

The XNOR gates 120 and 295 in systems 100 and 200, respectively, determine if an error which must be accounted for has occurred. If a hit is expected and an extra bit is on, the hit signal generated by AND gate 232 will be set and the miss signal generated by OR gate 292 will be set. If a hit is expected and a bit has gone off, the hit signal from the AND gate 232 will be off and the miss signal from the OR gate 292 will still be off. Thus, the errors preclude the hit and miss signals from being orthogonal.

For example, suppose that a hit is expected between the instances of the address. Assume that the b2 encoding of the instances should be 0100. Suppose that one bit from the second instance, such as bit b(0), has turned on due to an error. In the hit logic of FIG. 4, the resultant of the AND gate 222 will still be off. The resultant from OR gate 230 will still be on. The hit signal for this pair of instances will be set. If no other error has occurred, the collective hit signal generated by OR gate 232 will still be set.

The miss logic will also cause the miss signal to be set. Because bit b(0) is on, the resultant of the OR gates 264, 274, and 284 will be on. Therefore, the resultant of AND gate 262 will be on. The miss signal for these bits will be set. Similarly, the collective miss signal generated by OR gate 292 will be set. Therefore, the error prevents the hit and miss signals from being orthogonal.

Similarly, suppose a hit is expected between the pair of instances. Also assume that the b2 encoding of each instance should be 0100. Suppose that bit b(1) from the second instance has turned off due to an error. In the hit circuitry of FIG. 4, the resultant of the AND gate 224 will then be off. The resultant from OR gate 230 will then be off. The hit for this pair of instances will be off. The collective hit generated by AND gate 232 will be off.

Where bit b(1) has gone off, the miss signal will also be off. Because bit b(1) is off, the resultant of the OR gates 254, 274, and 284 will be off. The resultant of AND gate 262 will also be off. The miss for these bits will be off. Similarly, the collective miss signal generated by OR gate 292 should be off.

In the case of either error, the hit and miss signals will not be orthogonal. As a result, either error causes the output signal of the XNOR gate 295 to be on. Consequently, the XNOR gate 295 detects errors where a bit has turned on or off. Referring back to FIG. 3, the system 100 including the hit and miss logic and the XNOR gate 120 function similarly to the system 200 in FIG. 4.

If a miss is expected, and the error does not create an observable fault, then the miss signal will be set and the hit signal will be off. For example, if any of the lines from the remaining miss logic 294 are set due to a miscompare, a miss signal will be generated regardless of any errors in the bits a(0) though a(3) and b(0) though b(3). An error in these bits is not observable if the error does not cause the hit signal to be set.

For example, suppose a(0) is a one and only b(1) should be a one. Further, suppose an error causes b(2) to change from a zero to a one. This error will not change the resultants of AND gates 222, 224, 226 and 228. Therefore, the resultants of AND gate 232 will be off and the hit signal will be off. The error does not create an observable fault, and the hit and miss signals will be orthogonal in the systems 100 and 200. Because such errors are not otherwise observable and do not implicate system performance, these errors need not be detected. In addition, detection of such errors may actually be undesirable.

However, if the error creates an observable fault, then the hit and miss signals will not be orthogonal and the error will be detected. For example, if a miss is expected and the only miscompared bit in the field has turned off, then the miss signal will be off and the hit signal will be off. Similarly, if a miss is expected and a bit causing an observable error has turned on, both the hit signal and the miss signal will be on.

For example, suppose a(0) is a one, only b(1) should be a one and the only miscompare is generated from the bits a(0) through a(3) and b(0) through b(3). Further, suppose that b(0) goes from a zero to a one due to an error. This error will cause the resultant of AND gate 222 to be on. Because all lines from the remaining hit circuitry 234 are on, the hit will also be on. The error, therefore, caused an observable fault, and both the hit and miss signals are on. Thus where an error causes an observable fault, the hit and miss signals are not orthogonal. Where an error does not create an observable fault, the hit and miss are signals orthogonal. Consequently, the method and system detect only relevant errors.

The method and system can be extended to situations where data is interleaved to detect double bit errors occurring on adjacent bits. It is often desirable to detect multiple bit errors that occur on adjacent bits. Error detection on adjacent bits is desirable because alpha particles can cause two adjacent bits to flip. A conventional method for dealing with an adjacent double bit error is to interleave two pieces of data that do not share the same error checking mechanism.

If the cache is set associative, the interleaving can be accomplished by interleaving the ways. In such a system the nth bits for the tags are grouped together. For example, if the cache is four way set associative, the first bits in each of the four tags are grouped together. The second bits in the four tags are grouped together. The remaining bits are treated similarly. As a result, all the bits for a single tag will not be physically adjacent to each other. A double bit error, such as one generated by an alpha particle, will, therefore, only cause a single error in a particular tag. The error will be detectable. In such a situation, the method and system for error detection in accordance with the present invention functions as above.

If the data is direct mapped, for example where the cache is one-way set associative, and detection of multiple adjacent bit errors is required, the method and system for providing error detection in accordance with the present invention may be modified. In a direct mapped system, there is no opportunity for interleaving the ways. In such a system, the hit and miss circuitry is divided into two parts for two portions of data. The bits for the two parts are interleaved.

A hit and a miss for each of the two parts are generated. The global hit is generated by performing an AND of the hits for each of the two parts. The global miss would be generated by performing an OR of the misses for each of the two parts. The method and system for error detection would then detect an error when either of the two parts of the hit and miss are not orthogonal.

The XNOR gates 120 and 295 used to determine the orthogonality of the hit and miss signals require inversions. However, only the hit and the miss signal, are inverted. Consequently, error checking of the directory array is provided without requiring inversion of the relatively large number of bits. As a result, the timing costs and additional circuitry of conventional error checking are avoided. In addition, because the hit and miss logic are provided in most dynamic directory arrays, the circuitry to generate the hit and miss is already present. Finally, the method and system provide error detection at lower cost.

A method and system has been disclosed for providing error detection in dynamic directory arrays. The method and system require fewer inversions than conventional systems, thereby increasing the speed. The method and system also require less circuitry than conventional error detection. In addition, the present invention may detect those errors which are of interest.

For example, the present invention provides for a method and system for rapidly and efficiently detecting errors in a data set, such as an address. The present invention has been described in terms of true/complement and b2 encoding. However, one of ordinary skill in the art will readily recognize that this method and system will operate effectively for other types of encoding and other systems.

The present invention has also been described using particular logic circuitry. However, one of ordinary skill in the art will realize that the method and system function effectively for other types of logic circuitry. In addition, the present invention has been described in terms of a hit and miss generated between a portion of the address and a tag from a dynamic directory of a cache. However, the method and system could be used for any two data fields compared by some type of hit and miss logic circuitry, including a translation of the upper portion of the address and the tag.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A system for detecting at least one error in a directory comprising:
   comparing means for comparing a first group of data and a second group of data to provide a first comparison signal and a second comparison signal; and
   an error detection circuit coupled to the comparing means for detecting the at least one error based on whether the first comparison signal and the second comparison signal are orthogonal.

2. The system of claim 1 wherein the first group of data is an address and the second group of data is directory address.

3. The system of claim 1 wherein the error detection circuit further comprises:
   means for determining if the first comparison signal and the second comparison signal are orthogonal, wherein the at least one error is detected when the first comparison signal and second comparison signal are not orthogonal.

4. The system of claim 3 wherein the determining means further comprise:
   exclusive nor (XNOR) means for providing an exclusive nor of the first comparison signal and the second comparison signal, the XNOR providing a high output signal when the at least one error is detected.

5. The system of claim 4 wherein the first comparison signal is a hit and the second comparison signal is a miss.

6. The system of claim 5 wherein the first group of data and the second group of data are in b2 encoding.

7. The system of claim 5 wherein the first group of data and the second group of data are in true/complement representation.

8. A system for providing detection of at least one error in a dynamic circuit, the dynamic circuit including a plurality of groups of data, the system comprising:
   means for comparing two groups of the plurality of groups of data and providing a first resultant indicating whether the two groups match and a second resultant indicating whether the two groups fail to match; and an error detection circuit coupled to the comparing means for detecting the at least one error based on whether the first resultant and the second resultant are orthogonal.

9. The system of claim 8 wherein the error detection circuit further comprises:

means for determining if the first resultant and the second resultant are orthogonal, wherein the at least one error is detected when the first and second resultant are not orthogonal.

10. The system of claim 9 wherein the determining means further comprises:

exclusive nor (XNOR) means for providing an exclusive nor of the first resultant and the second resultant, the XNOR providing a high output signal when an error is detected.

11. The system of claim 10 wherein the first resultant is a hit and the second resultant is a miss.

12. The system of claim 11 wherein the dynamic circuit further includes a directory; and wherein the two groups of the plurality of groups of data are an address and a directory address.

13. The system of claim 12 wherein the plurality of groups of data are in b2 encoding.

14. The system of claim 13 wherein the plurality of groups of data are in true/complement representation.

15. A method for detecting at least one error in a directory comprising the steps of:

(a) comparing a first group of data and a second group of data to provide a first comparison signal and a second comparison signal; and (b) detecting the at least one error based on whether the first comparison signal and the second comparison signal are orthogonal.

16. The method of claim 15 wherein the first group of data is an address and the second group of data is directory address.

17. The method of claim 15 wherein the error detection step (b) further comprises the step of:

(b1) determining if the first resultant and the second resultant are orthogonal, wherein the at least one error is detected when the first and second resultant are not orthogonal.

18. The method of claim 17 wherein the determining step (b1) further comprises the step of:

(b1i) providing an exclusive nor of the first resultant and the second resultant, the XNOR providing a high output signal when an error is detected.

19. The method of claim 18 wherein the first resultant is a hit and the second resultant is a miss.

20. The method of claim 19 wherein the first group of data and the second group of data are in b2 encoding.

21. The method of claim 19 wherein the first group of data and the second group of data are in true/complement representation.

22. A method for detecting at least one error in a dynamic circuit, the dynamic circuit including a plurality of groups of data, comprising the steps of:

(a) comparing two groups of the plurality of groups of data and providing a first resultant indicating whether the two groups match and a second resultant indicating whether the two groups of data fail to match; and (b) detecting the at least one error based on whether the first resultant and the second resultant are orthogonal.

23. The method of claim 22 wherein the error detecting step further comprises the step of:

(b1) determining if the first resultant and the second resultant are orthogonal, wherein the at least one error is detected when the first and second resultant are not orthogonal.

24. The method of claim 23 wherein the determining step (b1i) further comprises the step of:

(b1i) providing an exclusive nor of the first resultant and the second resultant, the XNOR providing a high output signal when an error is detected.

25. The method of claim 24 wherein the first resultant is a hit and the second resultant is a miss.

26. The method of claim 25 wherein the dynamic circuit further includes a directory; and wherein the two groups of the plurality of groups of data are an address and a directory address.

27. The method of claim 26 wherein the plurality of groups of data are in b2 encoding.

28. The method of claim 27 wherein the plurality of groups of data are in true/complement representation.

* * * * *